(12) United States Patent
Liu et al.

(10) Patent No.: US 11,342,861 B2
(45) Date of Patent: May 24, 2022

(54) METHOD AND APPARATUS TO MITIGATE DC BUS OVER-VOLTAGES ON COMMON AC BUS SYSTEMS UTILIZING DC AND AC DRIVES

(71) Applicant: Rockwell Automation Technologies, Inc., Mayfield Heights, OH (US)

(72) Inventors: Zhijun Liu, Colgate, WI (US); Gary L. Skibinski, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/037,979

(22) Filed: Sep. 30, 2020

(65) Prior Publication Data

US 2022/0103086 A1 Mar. 31, 2022

(51) Int. Cl.
*H02M 5/458* (2006.01)
*H02P 23/00* (2016.01)
*H03H 7/06* (2006.01)

(52) U.S. Cl.
CPC ............ *H02M 5/458* (2013.01); *H02P 23/00* (2013.01); *H03H 7/06* (2013.01); *H02P 2201/01* (2013.01)

(58) Field of Classification Search
CPC .... H02M 5/458; H02P 23/00; H02P 2201/01; H03H 7/06
See application file for complete search history.

(56) References Cited

U.S. PATENT DOCUMENTS

| | | | | |
|---|---|---|---|---|
| 9,595,906 B2* | 3/2017 | Yamamoto | ............. | H02P 29/60 |
| 10,069,444 B2* | 9/2018 | Niwa | ..................... | H02M 5/458 |
| 10,355,585 B2 | 7/2019 | Li et al. | | |
| 10,476,381 B1* | 11/2019 | Sartler | .................. | H02M 1/126 |
| 2014/0265972 A1* | 9/2014 | Xu | ........................ | H02M 7/493 |
| | | | | 318/400.42 |
| 2016/0077142 A1* | 3/2016 | Kanayama | ............. | G01R 31/42 |
| | | | | 324/750.3 |
| 2016/0164448 A1* | 6/2016 | Kane | ..................... | H02M 1/126 |
| | | | | 318/400.24 |
| 2016/0248334 A1* | 8/2016 | Patel | .................... | H03H 7/1741 |

FOREIGN PATENT DOCUMENTS

CA 2268480 C 10/2000

\* cited by examiner

*Primary Examiner* — Bickey Dhakal
(74) *Attorney, Agent, or Firm* — Fay Sharpe LLP (57) ABSTRACT

A method and line interface filter apparatus to couple a drive or group of drives to a shared multiphase AC bus, including individual phase circuits having an inductor coupled between a respective bus and drive phase lines, a resistor coupled to the respective drive phase line, and a capacitor coupled between the resistor and a common connection of the capacitors of the individual phase circuits, where the capacitance of the capacitors is 5 to 15 times a per-phase equivalent capacitance of the drive or group of drives, and the resistance of the resistors is two times a damping ratio times a square root of a ratio of the filter inductance to the filter capacitance, where the damping ratio is greater than or equal to 1.0 and less than or equal to 2.0.

13 Claims, 7 Drawing Sheets

METHOD AND APPARATUS TO MITIGATE DC BUS OVER-VOLTAGES ON COMMON AC BUS SYSTEMS UTILIZING DC AND AC DRIVES

BACKGROUND INFORMATION

The subject matter disclosed herein relates to power systems with a shared AC bus.

BRIEF DESCRIPTION

In one aspect, a system is provided having a shared multiphase AC bus, an AC drive, a multiphase line interface filter, and a further drive. The AC drive has a multiphase AC input; a diode rectifier, an input filter, and an inverter. The multiphase line interface filter includes phase circuits are coupled to respective phase lines of the shared multiphase AC bus and include an inductor, a resistor and a capacitor. The individual inductors have a first terminal coupled to the respective phase line of the shared multiphase AC bus, and a second terminal coupled to a respective phase of the multiphase AC input. The individual resistors have a first terminal coupled to the respective phase of the multiphase AC input, and a second terminal, and the individual capacitors have a first terminal coupled to the second terminal of the resistor, and a second terminal, with the second terminals of the capacitors of the individual phase circuits being coupled together. The further drive has a further AC input coupled to the shared multiphase AC bus, and an SCR rectifier coupled to the further AC input.

A system is provided in another aspect, which includes a shared multiphase AC bus, an AC drive, a further drive, and a further line interface filter. The AC drive has a multiphase AC input, a diode rectifier, an input filter, and an inverter. The further drive has a further AC input coupled to the shared multiphase AC bus, and an SCR rectifier coupled to the further AC input. The further line interface filter has further phase circuits coupled to respective phase lines of the shared multiphase AC bus. The individual further phase circuits include a further resistor coupled to the respective phase of the further multiphase AC input, and a second terminal, as well as a further capacitor having a first terminal coupled to the second terminal of the further resistor, and a second terminal, where the second terminals of the further capacitors are coupled together.

In another aspect, a method includes determining a filter inductance as, 3% to 5% of a per-phase equivalent inductance of an input reactor based on the total KVA rating and rated voltage of the drive or group of drives, or 5% to 8% of a per-phase equivalent inductance of an isolation transformer. The method also includes determining a filter capacitance as 5 to 15 times a per-phase equivalent capacitance of the drive or group of drives, and determining a filter resistance as greater than or equal to two times a damping ratio times a square root of a ratio of the filter inductance to the filter capacitance, where the damping ratio is greater than or equal to 1.0 and less than or equal to 2.0. The method further includes coupling a multiphase line interface filter coupled between a drive or group of drives and a shared multiphase AC bus, where the multiphase line interface filter includes phase circuits coupled to respective ones of the phase lines of the shared multiphase AC bus. The individual phase circuits include an inductor, a resistor and a capacitor. The inductor has the filter inductance, a first terminal coupled to the respective phase line of the shared multiphase AC bus, and a second terminal coupled to a respective phase of a multiphase AC input of the drive or group of drives. Thee resistor has the filter resistance, a first terminal coupled to the respective phase of the multiphase AC input, and a second terminal, and the capacitor has the filter capacitance, a first terminal coupled to the second terminal of the resistor, and a second terminal, where the second terminals of the capacitors of the individual phase circuits are coupled together.

DETAILED DESCRIPTION

Figure 1:
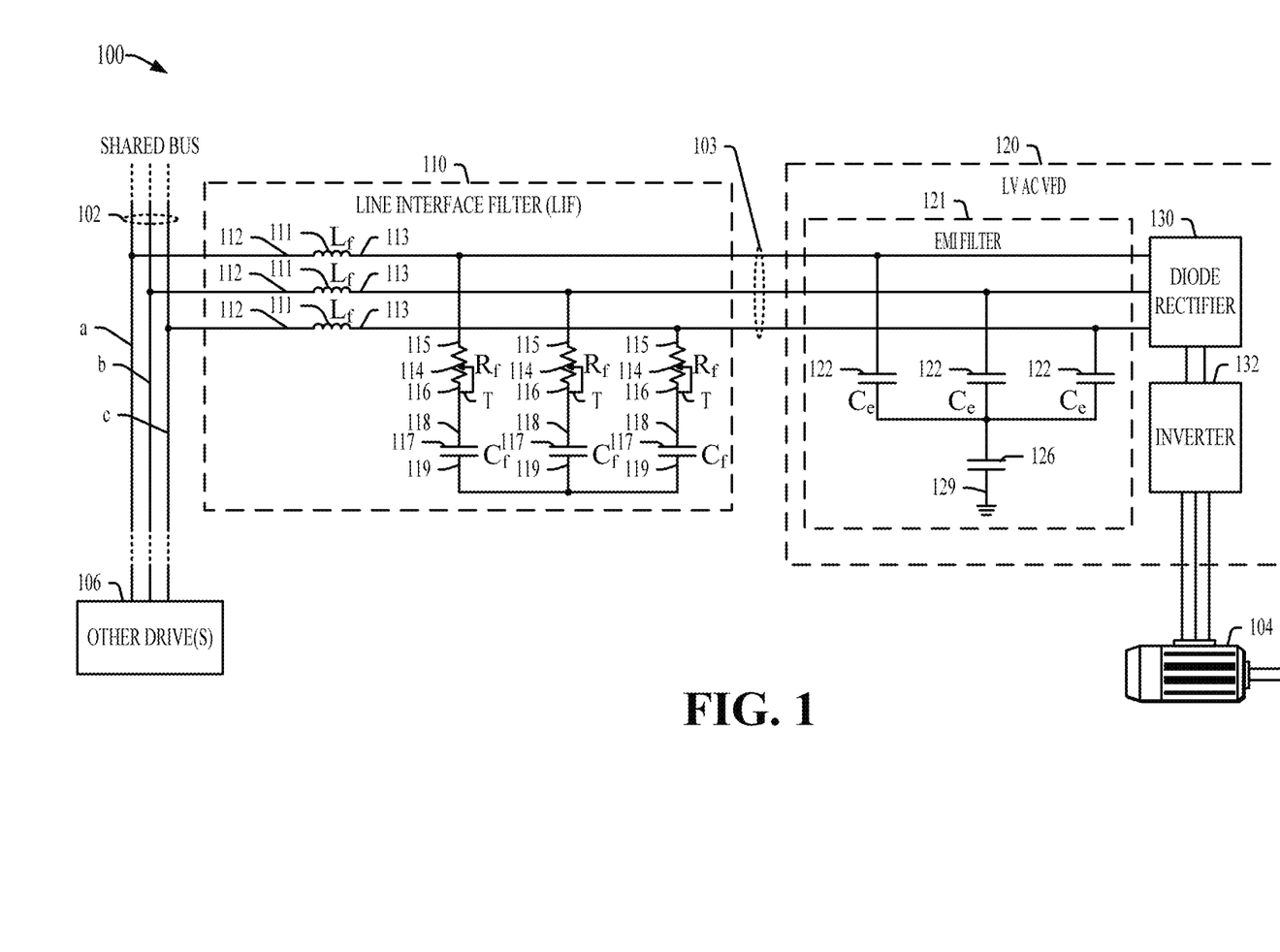
FIG. 1 is a schematic diagram of a power system with a shared AC bus and a line interface filter coupled to a drive with a diode front end rectifier.

FIG. 1 shows a power system 100 with a shared AC bus 102 with one or more further drives 106, as well as a line interface filter 110 (LIF) coupled to a low voltage AC variable frequency drive 120 (e.g., LV AC VFD) a multiphase AC input 103, and a three-phase AC output that drives a motor load 104. The shared multiphase AC bus 102 is a three-phase bus with phase lines a, b and c. The illustrated systems have three-phase AC connections. In other examples, more than three phases can be used. The line interface filter 110 is coupled between the shared multiphase AC bus 102 and the multiphase AC input 103 of the AC drive 120. The shared AC bus 102 is coupled to one or more other or further drives shown schematically in FIG. 1. In various examples, the other drive or drives 106 includes one or more low voltage DC drives (LV DC) and/or one or more medium voltage AC variable frequency drives (e.g., MV AC VFD) with one or more associated isolation transformers. The further drive or drives 106 have one or more corresponding further AC inputs (e.g., 203 in FIGS. 2 and 3 below) coupled to the shared multiphase AC bus 102, as well as a silicon controlled rectifier (SCR) rectifier circuit coupled to the further AC input.

In practice, connection of a drive or drives 106 having an SCR rectifier to a shared AC bus 102 without the line interface filter 110 can cause undesirable overvoltage tripping of the LV AC VFD drive 120. Firing of the SCRs in the other drive or drives 106 creates notches in the corresponding phase voltages of the shared bus 102. However, it is desirable to use a single large capacity (e.g., large mega volt-amp or MVA) low voltage distributed shared common AC bus for multiple loads in a factory or facility, without the traditional approach of using transformers to separate ac drives, dc drives or motor loads, or other load types from one another, in order to reduce cost. Connecting a low voltage DC drive to the shared AC bus can cause AC line notching power quality problems, due to 6-pulse SCR phase control, potentially leading to DC bus overvoltage trip events in a connected low voltage AC variable frequency drive 120.

Certain SCR rectifier-based other drives 106 are themselves designed with AC line feedback voltage filtering to ignore their own line notches and those of others, so that the LV DC drives all function properly on a common bus. However, a low voltage AC variable frequency drive 120 or other AC drive with a diode front end rectifier can be affected by operation of an SCR-based rectifier in the other drive or drives 106 when connected to the common or shared AC bus 102.

The multiphase line interface filter 110 includes three phase circuits coupled to respective phase lines a, b and c of the shared multiphase AC bus 102. The individual phase circuits include an inductor 111, a resistor 114 and a capacitor 117. The individual inductors 111 each have a first terminal 112 and a second terminal 113. The first terminal 112 of each respective inductor 111 is coupled to the respective shared bus phase line a, b or c, and the second terminal 113 is coupled to a respective phase of the multiphase AC input 103. The inductors 111 of the individual phase circuits of the multiphase line interface filter 110 have an inductance $L_f$ of 3% to 5% of a per-phase source impedance X based on the KVA rating and rated voltage of the single LVAC drive 120.

The individual resistors 114 of the multiphase line interface filter 110 include a first terminal 115 and a second terminal 116. The first terminal 115 of each respective resistor 114 is coupled to the respective phase of the multiphase AC input 103. The individual capacitors 117 have a first terminal 118 coupled to the second terminal 116 of the resistor 114, and a second terminal 119. The second terminals 119 of the capacitors 117 of the individual phase circuits are coupled together.

The AC drive 120 includes a multiphase input filter 121, such as an electromagnetic interference (EMI) filter with capacitors 122 and 126, a diode front end rectifier 130, and an inverter 132. The input filter 121 is coupled between the multiphase AC input 103 and the diode rectifier 130, and the diode rectifier 130 is coupled between the input filter 121 and the inverter 132. The input filter capacitors 122 have first terminals coupled to respective phases of the multiphase AC input 103, and second terminals coupled to one another. The fourth filter capacitor 126 is coupled between the second terminals of the capacitors 122 and a ground or other reference voltage node 129. The input filter 121 has a per-phase equivalent capacitance $C_{eq}$.

The diode rectifier 130 includes rectifier switching devices coupled between the multiphase AC input 103 and a DC bus, for example, having a DC bus capacitor (not shown). The output inverter 132 includes inverter switching devices coupled between the DC bus circuit and the AC output to provide AC output signals to drive the motor load 104. AC drive 120 includes a controller that operates the inverter 132 by providing inverter switching control signals. Operation of an SCR-based rectifier in the other drive or drives 106 on the shared AC bus 102 can cause loss of volt-second area from deep notches near the sinewave peak, and reduce the AC drive DC bus voltage by 5%. This condition may still allow proper operation of the inverter 132 and the AC motor load 104 without DC bus undervoltage tripping.

However, AC variable frequency drive DC bus overvoltage issues can arise on a low voltage shared AC bus from second order effects in a low voltage DC drive. DC drive non-ideal characteristics are applied to every device on the AC line and include SCR snubber high voltage commutation spikes and DC drive SCR snubber high frequency ring between DC drives that may interact with the AC variable frequency drive line side 121 EMI filter network resonant frequency to develop amplified voltage. The amplified voltage, along with LVDC drive high voltage commutation spikes are rectified by the 6-pulse diode bridge of diode rectifier 130 can charge up the AC drive DC bus capacitance to random and often unexplained overvoltage trip shutdown levels. The example multiphase line interface filter 110 and further described methods and apparatus provide an inventive method & apparatus topology that is a pre-engineered and pre-analyzed product to mitigate the non-ideal DC drive characteristics reflected onto the shared common AC bus 102. In one example, the multiphase line interface filter 110 damps out voltage oscillations and mitigates DC drive voltage spikes at the AC drive input side of the LV AC VFD 120 to prevent undesirable DC bus overvoltage shutdown events. In other examples described below, a line interface filter (e.g., filter 210 in FIGS. 2, 3, 6 and 7 below) can be applied at the problem source, such as a low voltage DC drive or a medium voltage drive, which include SCR-based rectifiers. Certain examples, moreover, apply the line interface filter apparatus to medium voltage topology AC line side using phase control front end converters. The described examples provide a solution to mitigate or eliminate exhaustive overvoltage trip engineering failure analysis for every new shared AC bus system configuration.

The capacitors 117 of the individual phase circuits of the multiphase line interface filter 110 have a capacitance $C_f$ of 5 to 15 times the per-phase equivalent capacitance $C_{eq}$ of the AC drive 120. The resistors 114 of the individual phase circuits have a resistance $R_f$ greater than or equal to two times a damping ratio $\zeta$ times a square root of a ratio of the inductance $L_f$ to the capacitance $C_f$. The damping ratio $\zeta$ is greater than or equal to 1.0 and less than or equal to 2.0, such as about 1.2 in one example. In the illustrated example, the resistors 114 of the individual phase circuits of the multiphase line interface filter 110 each include a tap T to set the corresponding resistance Rf.

Figure 6:
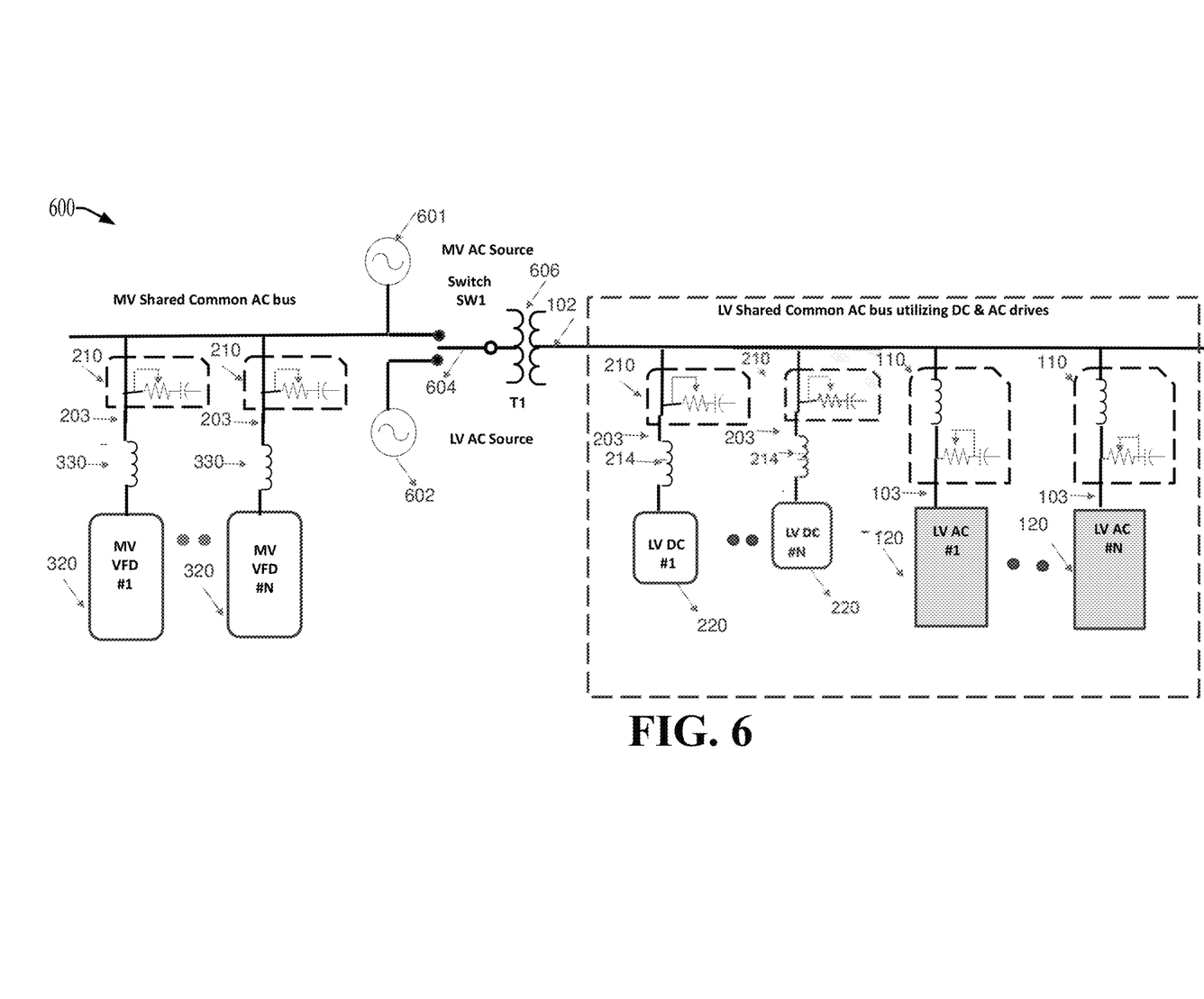
FIG. 6 is a schematic system diagram of a shared AC bus system.
Figure 7:
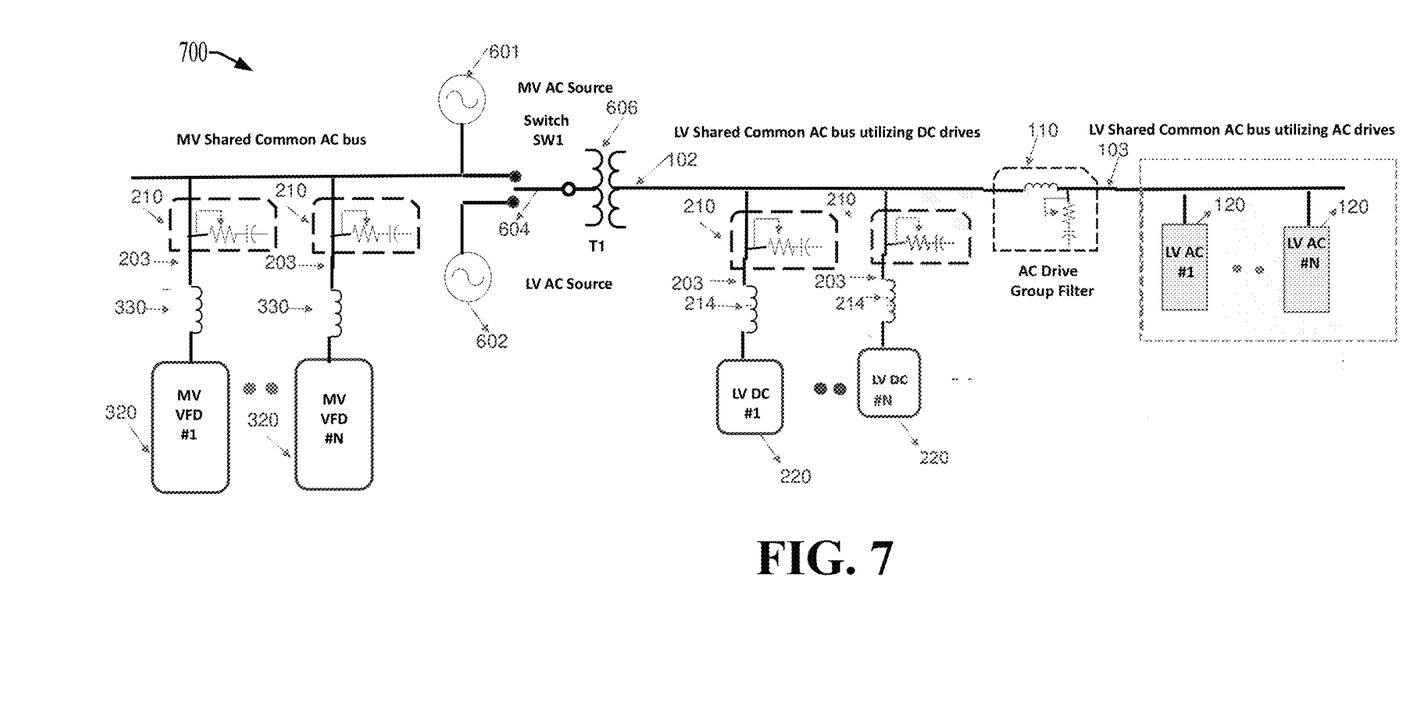
FIG. 7 is a schematic system diagram of another shared AC bus system.

The multiphase line interface filter 110 provides an overdamped second order filter that suppresses second order effects caused by SCR-based rectifiers in the other drive or drives 106 to mitigate or avoid undesired DC bus overvoltage trip events in the protected low voltage variable frequency drive 120. A single line interface filter 110 of this construction can be provided at the line input side of individual low voltage variable frequency drives 120 connected to a shared bus 102, alone or in combination with a further line interface filter 210 at the line interface of the individual other drives as shown in FIG. 6 below. In another system configuration, a single protective line interface filter 110 can be coupled between the shared AC bus 102 and the multiphase AC inputs 103 of a group of protected low voltage variable frequency drives 120, as shown in FIG. 7 below.

The line interface filter 110 in FIG. 1 damps out the voltage oscillation at the AC drive multiphase AC input 103. The line interface filter 110 includes the resistors 110 ($R_f$), capacitors 117 ($C_f$) and the input filter 121 has equivalent per-phase capacitors 122 of capacitance $C_{eq}$, along with the inductors 111 ($L_f$) to form an RLC circuit to mitigate the voltage oscillation. The transfer function can be derived as below:

$$\frac{V_o(s)}{V_i(s)} = \frac{R_f C_f s + 1}{R_f L_f C_f C_{eq} s^3 + L_f (C_f + C_{eq}) s^2 + R_f C_f s + 1}$$

When selecting Cf sufficiently high (e.g., Cf>(5~15)Ceq is usually sufficient) and properly selecting Rf as indicated below, the dynamic behavior of the voltage Vo will be dominated by the components Lf, Rf and Cf (the dynamic oscillating power or current exchange is mainly between Lf and Cf and the impact of Ceq will be minimum. With this condition, the above transfer function can be reduced to the following second order system:

$$\frac{V_o(s)}{V_i(s)} \cong \frac{\frac{R_f}{L_f}\left(s + \frac{1}{R_f C_f}\right)}{s^2 + \frac{R_f}{L_f}s + \frac{1}{L_f C_f}}$$

The system ω and damping factor ζ can be derived as follows:

$$\frac{V_o(s)}{V_i(s)} = \frac{K(s+z)}{s^2 + 2\zeta\omega_n s + \omega_n^2}$$

$$\omega = \frac{1}{\sqrt{L_f C_f}}, \zeta = \frac{R_f}{2\sqrt{\frac{L_f}{C_f}}}$$

When specifying damping ratio, the filter resistance Rf can be calculated as:

$$R_f = 2\zeta\sqrt{\frac{L_f}{C_f}}, \text{ for } \zeta = 1.2, R_f = 2.4\sqrt{\frac{L_f}{C_f}}$$

Once the line reactor Lf is known, the filter capacitance Cf can be selected first to swamp out the effect of EMI capacitance Ce, and then choose damping ratio ζ to determine the resistance Rf:

To damp out voltage oscillation and reduce the peak voltage, a minimum "ζ"=0.707 for 2nd order system would be required. However, an overdamping value "ζ"=1.2 is selected to minimize peak overshoot voltage to a line notch step response besides eliminating oscillations so that the VFD DC bus does not peak charge to the overshoot.

With this resistance value calculated, and assuming a non-inductive resistor winding type is used, then the per unit step responses of the system with different C values is obtained. A filter with ζ=1.2 for Rf assuming Cf=8.4*Ce=4.7 uF can effectively damp out the oscillation and significantly reduce the peak voltage with only 20% overshoot. For ζ=1.2 for Rf, Lf=450 uH, Ce=0.56 uF, when without a filter, peak voltage can be almost 3× the steady state voltage when multiple low voltage DC drives are on the same AC line, since the space between line notches could vary or almost synchronize between SCR DC drive firing angle α=30 to 90 degree. As a result, the first line notch response does not decay and the second nearby notch double pumps up the line step response.

The multiphase line interface filter 110 in one example includes a standard low cost and readily available AC line reactor (Lf) of approximately 3% (e.g., 0.03 pu) or more of the per-phase source impedance (X) based on the single LVAC drive 120 VA rating (VAr) and rated voltage (Vr). Filter inductance can then be calculated as Lf=(0.03 pu* (Vr)$^2$)/(VAr*2*π*f_utility).

The multiphase line interface filter 110 in this example also includes a pre-designed assembly having the resistors 114, where Rf is pre-selected value for the variable frequency drive hp size, and fixed capacitors 117 (Cf) with a value suitable for use with multiple AC variable frequency drive sizes. In the illustrated example, Cf is selected to be five or more times larger than the EMI filter per-phase equivalent capacitance Ce. Since the AC variable frequency drive capacitance Ce capacitor is the same value for a large range of drive horsepower sizes from 1 Hp to 250 Hp, this allows a single Cf capacitor to be implemented in an assembly. Moreover, the illustrated example uses tapped resistors 114 having taps T to set the filter resistance Rf. This allows a single assembly to be installed with inductors 111 and suitable tap settings to accommodate many different protected LV AC VFD drives 120. In one example, the per-phase inductance Lf is selected as 3% to 5% impedance based on the AC bus voltage and the rated current of the drive 120. The drive equivalent inherent per-phase capacitance identified as from drive internal EMI filter capacitance Ce (e.g., Ceq=Ce).

Figure 2:
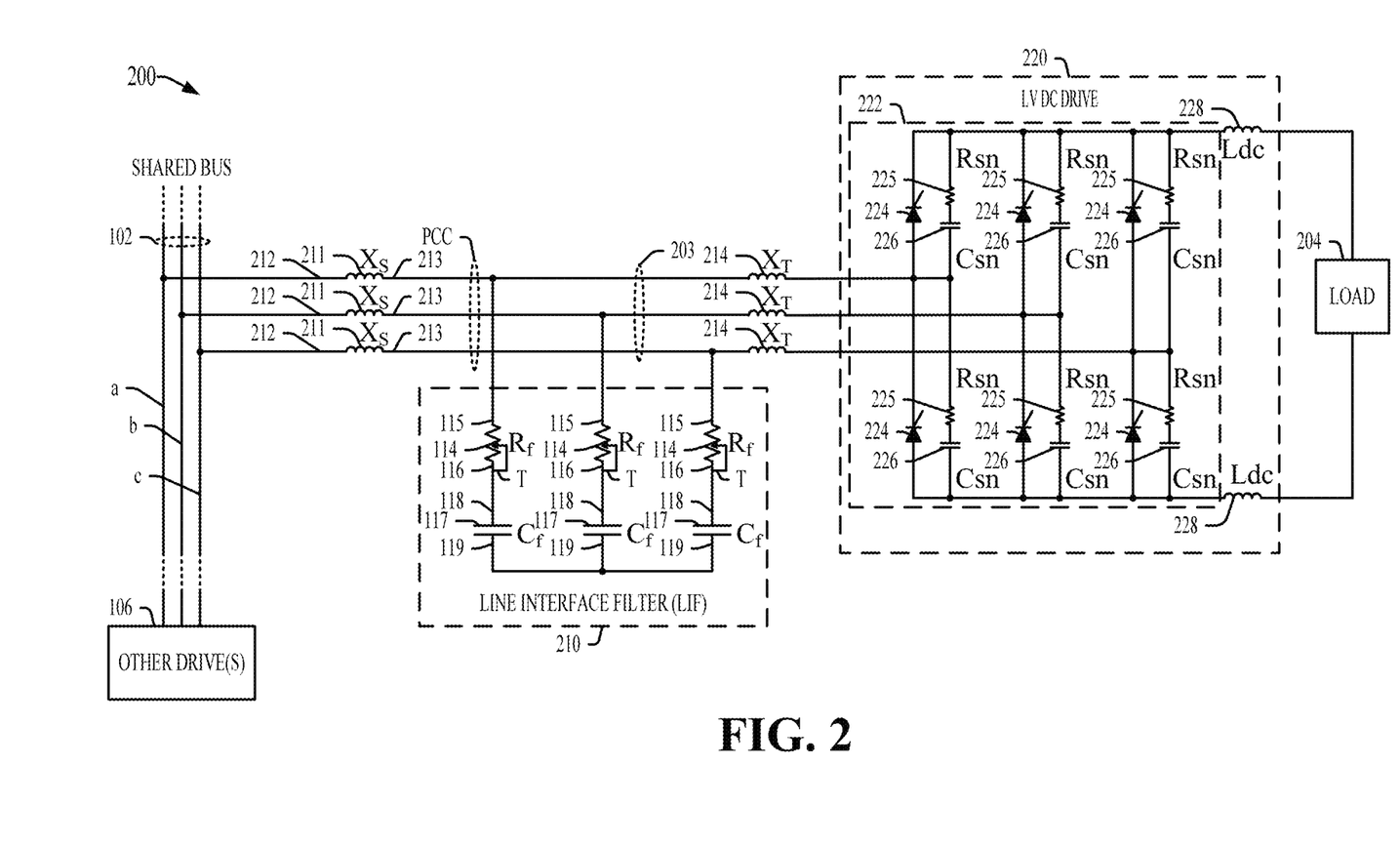
FIG. 2 is a schematic diagram of another power system with a shared AC bus and a line interface filter coupled to a drive with an SCR rectifier.

FIG. 2 shows anther power system configuration 200 with the shared AC bus 102 and a further line interface filter 210 coupled to a low voltage DC drive 220 (LV DC) with an SCR rectifier 222 and output inductors 228 to drive a load 204. The further drive 220 has a further AC input 203 coupled to the shared multiphase AC bus 102, and the SCR rectifier 222 is coupled to the further AC input 203. The system 200 shows a utility source impedance as inductors 211 of inductances Xs, first terminals 212 coupled to the shared bus 102, and second terminals 213 coupled to the line interface filter and the drive 220 at a point of common coupling PCC. The shared AC bus 102 in this example has AC phase voltages $e_a$, $e_b$ and $e_c$, and the point of common coupling has AC phase voltages $V_a$, $V_b$ and $V_c$. In this example, the inductors 211 represent the is the low voltage utility source AC impedance and the further inductors 214 ($X_T$) are the input inductors of the DC drive, such as existing % Z AC line reactance (e.g., $L_T = X_T/(2*\pi*f)$) to reduce shared AC bus line notch depth.

The LV DC drive 220 has an SCR-based rectifier circuit 222 with upper and lower SCRs 224 for each phase line. The SCRs have associated snubber networks that individually include a snubber resistor 225 and a snubber capacitor 226. In operation, during SCR commutation, two lines are shorted together so that the resulting AC bus notch depth is a voltage divider between the impedances $X_T$ and $X_S$. The line-to-line equivalent circuit input impedance immediately following SCR commutation turn-off Req=Rsn/3, Ceq=3 Csn. In one example, moreover, the per-phase equivalent inductance Lf for the line interface filter 210 is set to an existing LV DC drive inductance $L_T$. The further line interface filter 210 includes further phase circuits coupled between the shared multiphase AC bus 102 and the further AC input 203, for example, at the point of common coupling PCC of the respective phase of the further multiphase AC input 203 as shown in FIG. 2. The multiphase line interface filter 210 operates with the existing inductors 214 to form per-phase RLC filter circuits that protect the shared AC bus 102 from notches created by commutation of the SCR rectifier 222. The inductors 214 of the individual phase circuits of the multiphase line interface filter 210 have an inductance $X_T$ of 3% to 5% of a per-phase source impedance X. based on the KVA rating and rated voltage of the single LV DC drive 220.

The capacitors 117 of the individual phase circuits of the multiphase line interface filter 210 have a capacitance $C_f$ of 5 to 15 times a per-phase equivalent capacitance $C_{eq}$ of the LV DC drive 220, and the resistors 114 of the individual phase circuits of the multiphase line interface filter 210 have a resistance $R_f$ greater than or equal to two times a damping ratio $\zeta$ times a square root of a ratio of the inductance $L_T$ to the capacitance $C_f$, where the damping ratio $\zeta$ is greater than or equal to 1.0 and less than or equal to 2.0, such as about 1.2 in one example. In the illustrated example, the equivalent capacitance of the DC drive 220 is based on the capacitance Csn of the snubber capacitors 226. In one example, the capacitance $C_f$ is set to 5× Ceq=15× Csn. As in the above example protective line interface filter 110, the guarding line interface filter 210 includes tapped filter resistors 114 with individual taps T to set the corresponding resistance $R_F$.

The added inductors 214 ($X_T$) and the shared AC bus source impedance Xs form a voltage divider that sets the notch depth at the point of common coupling PCC. In addition, if Rsn-Csn snubbers are under-damped, commutation voltage spikes, up to 2× peak sinewave voltage peak, can occur along with high frequency follow on ringing. Further, at low magnitude dc load current, dc bus ripple current interacts with the snubber circuit impedance Rsn-Csn and the line impedance Xs to form a highly oscillatory waveform at the PCC for all the drives coupled to the shared AC bus 102. The line interface filter adds the resistors 114 and capacitors 117 in each phase to provide an overdamped second order filter that suppresses second order effects caused by the SCR-based rectifier circuit 222 to mitigate or avoid undesired DC bus overvoltage trip events in the protected other drives 106 of FIG. 2.

Figure 3:
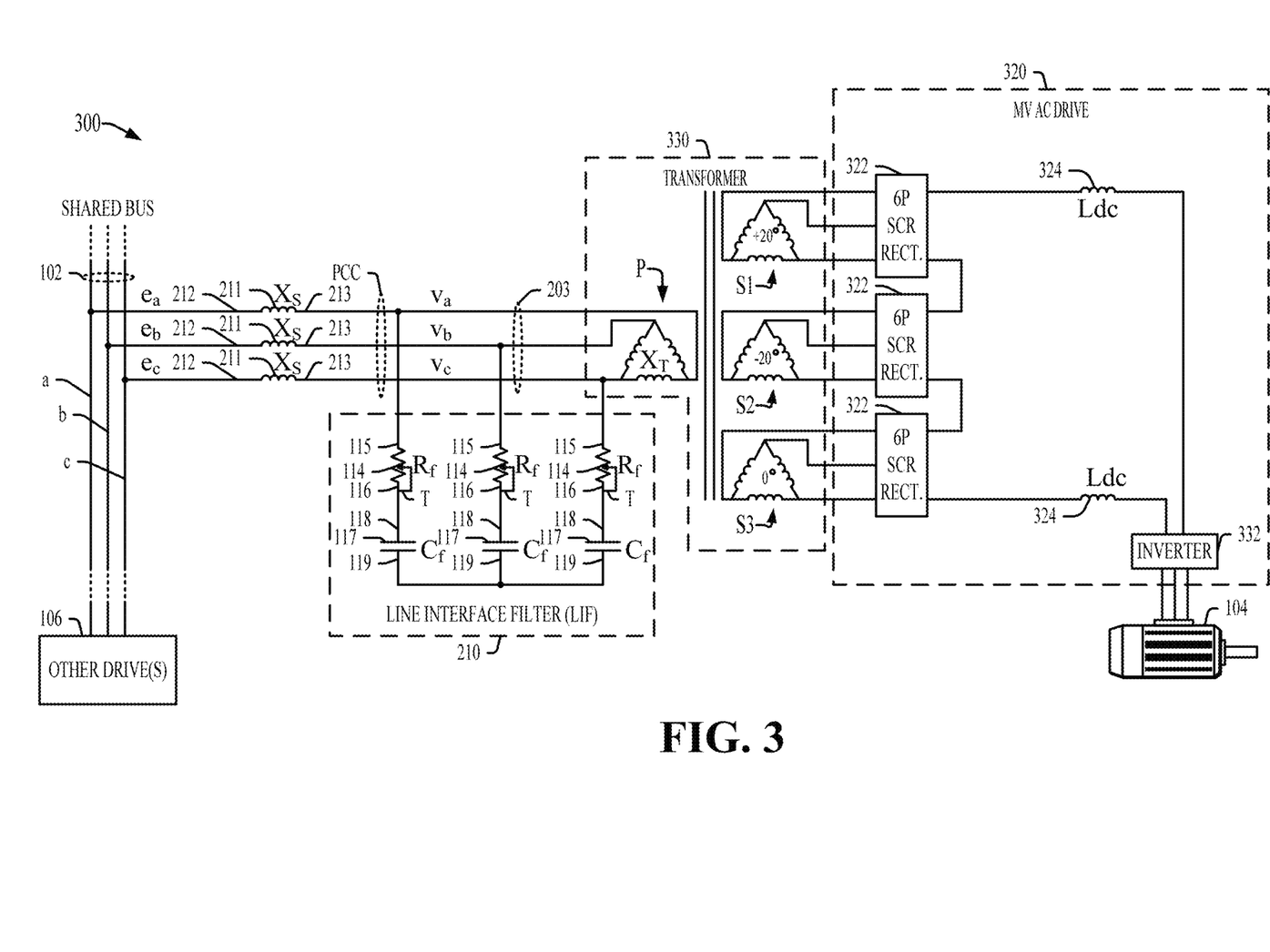
FIG. 3 is a schematic diagram of another power system with a shared AC bus and a line interface filter coupled to a drive with an isolation transformer and an SCR rectifier.

FIG. 3 shows another power system 300 with a shared AC bus 102 and a line interface filter 210 coupled to a medium voltage AC drive 320 (MV AC) with the impedance of an isolation transformer 330 and cascaded SCR rectifiers 322. The transformer 330 includes a three-phase, delta-connected, primary circuit P with a per-phase impedance $X_T$, as well as delta-connected, phase shifted, secondary circuits S1 (+20 degrees), S2 (−20 degrees) and S3 (0 degrees). Each three-phase secondary circuit is coupled to a six-pulse (6P) SCR rectifier 322, and the DC outputs of the individual 6P rectifiers 322 are coupled in series with one another to collectively provide a DC output. The DC output from the SCR rectifiers 322 is provided through DC link inductors 324 (Ldc) to an output inverter 332 that drives the motor load 104. The filter 210 is as described above in connection with FIG. 2 and can be used as part of a medium voltage shared bus 102 for connection at the point of common coupling PCC. The multiphase line interface filter 210 guards the shared bus 102 against the notches associated with operation of the 18 pulse DC converter with the three secondary phase shifted SCR 6-pulse bridge circuits 322. As described above, the individual SCR rectifiers 322 include respective Rsn Csn snubbers, the Xs is medium voltage utility source AC impedance and $X_T$ is 18 pulse isolation transformer % Z leakage reactance refereed to the primary side (LT=$X_T/(2*\pi*f)$) to reduce shared medium voltage AC bus line notch depth. The primary leakage reactance ($X_T$) and the shared AC bus source impedance Xs form a voltage divider that sets the notch depth at the point of common coupling PCC. During SCR commutation two lines are shorted together so that AC bus notch depth is a voltage divider between the impedances $X_T$ and Xs. The medium voltage line-to-line equivalent circuit input impedance immediately following SCR commutation turn-off is the result of the snubber capacitors of the three bridges 322 operating with each 6-pulse bridge (e.g., Req=Rsn/3, Ceq=3 Csn)*3 or Ceq=9*Csn. In one example, the per-phase filter capacitance Cf is calculated as [5× Ceq] or [45× Csn].

Figure 4:
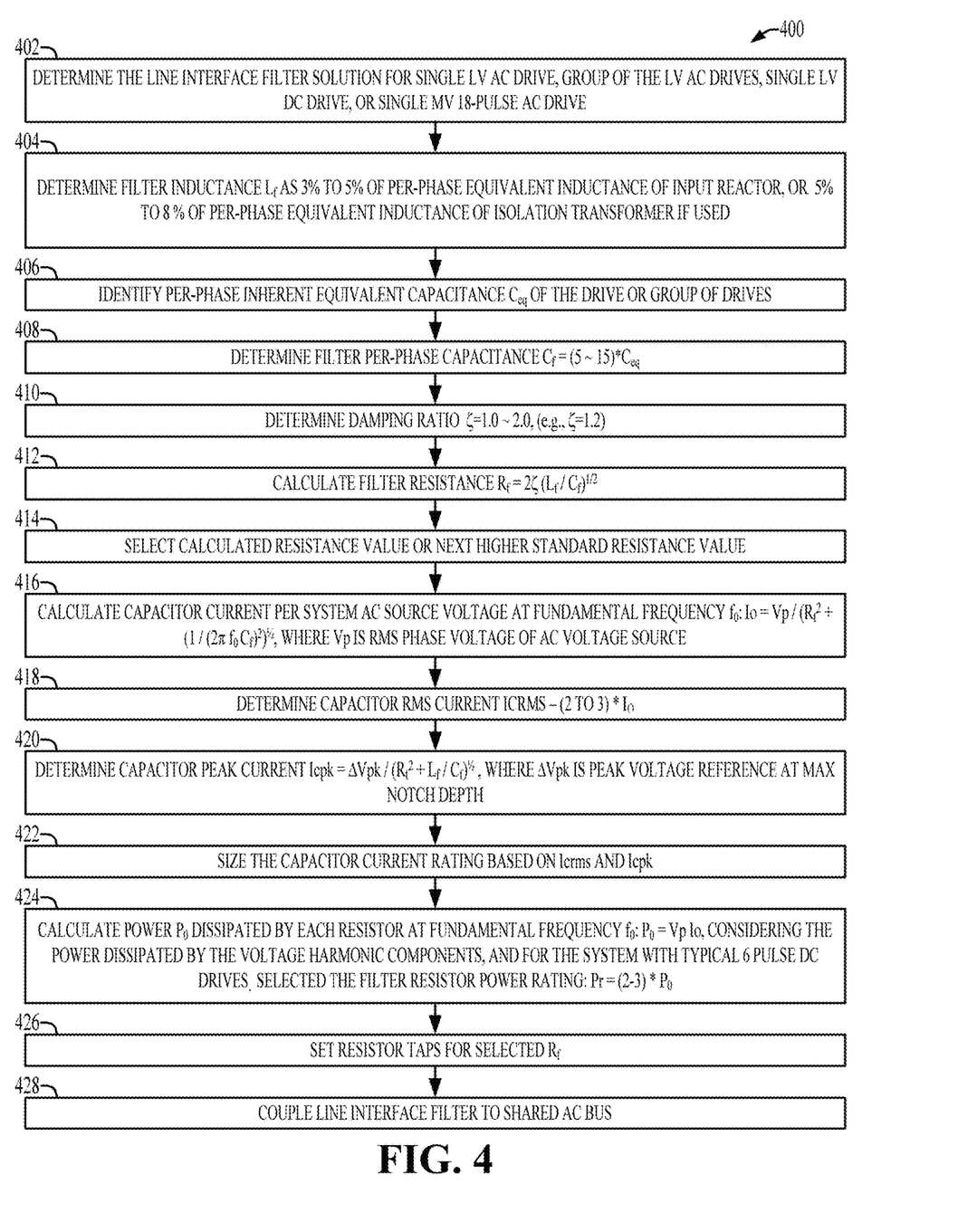
FIG. 4 is a flow diagram of a method of coupling a drive to a shared AC bus.

FIG. 4 shows a method 400 of coupling a drive or group of drives 120, 220, 320 to a shared multiphase AC bus 102. The method 400 begins at 402 and includes determining the line interface filter component value solution for one or more of a single LV AC drive (e.g., FIG. 1 above), a group of LV AC drives (e.g., FIG. 5 below), a single LV DC drive (e.g., FIG. 2 above), or a single MV 18-pulse AC drive (FIG. 3). At 404, the method 400 includes determining the filter inductance $L_f$ as one of 3% to 5% of a per-phase source impedance X based on the KVA rating and rated voltage of a single LVDC drive 220 (e.g., FIG. 2), 3% to 5% of a per-phase equivalent inductance of an input reactor based on the total KVA rating and rated voltage of a single LV AC 120 drive or group of LVAC drives 120 (e.g., FIGS. 1 above and 5 below), and 5% to 8% of a per-phase equivalent inductance X based on the primary referred leakage reactance of an isolation transformer 330 (e.g., FIG. 3 above). The per-phase equivalent capacitance Ceq of the drive or group of drives is determined at 406 in one example, and the method 400 continues at 408 with determining the per-phase filter capacitance $C_f$ as 5 to 15 times a per-phase equivalent capacitance $C_{eq}$ of the drive or group of drives.

The damping ratio $\zeta$ is determined at 410 of 1.0 or more and 2.0 or less (e.g., $\zeta$=1.2). The method 400 continues at 412 with determining the filter resistance $R_f$ as greater than or equal to two times the damping ratio $\zeta$ times a square root of a ratio of the filter inductance $L_f$ to the filter capacitance $C_f$. At 414 in one example, the filter resistance $R_f$ is set at 414 to the calculated value from 412 or the next higher standard resistor value. The capacitor current is calculated in one example at 416 according to the system AC source voltage at the fundamental frequency $f_0$: Io=$V_p/(R_f^2+(1/(2\pi f_0 C_f)^2)^{1/2}$, where $V_p$ is the rms phase voltage of the AC voltage source coupled to the shared AC bus 102. At 418, the method further includes determining the capacitor RMS current $I_{crms}$=(2 to 3)*Io. At 420, the method includes determining the capacitor peak current $I_{cpk}$=$\Delta V_{pk}/(R_f^2+L_f/C_f)^{1/2}$, where $\Delta V_{pk}$ is peak voltage reference at max notch depth. The capacitor current rating is sized at 422 based on $I_{crms}$ and $I_{cpk}$.

The method 400 continues at 424 with calculating the power $P_0$ dissipated by each filter resistor 114 at the fundamental frequency $f_0$: $P_0$=$V_p$ $I_0$, and considering the power dissipated by the voltage harmonic components. For a system (e.g., FIG. 2 above) with a 6 pulse SCR-rectifier based DC drive, the selected the filter resistor power rating $P_r$ is given as $P_r$=(2-3)*$P_0$. At 426, the example method 400 further includes setting the resistor value $R_f$ by setting the resistor taps T. The method 400 continues at 428 with coupling the multiphase line interface filter 110 between the drive or group of drives and the shared multiphase AC bus 102, where the multiphase line interface filter 110 includes phase circuits coupled to respective ones of the phase lines a, b, c. The individual phase circuits include the inductor 111 having the filter inductance $L_f$, a first terminal 112 coupled to the respective phase line a, b, c of the shared multiphase AC bus 102, and a second terminal 113 coupled to a respective phase of a multiphase AC input 103 of the drive or group of drives 120, 220, 320. The individual phase circuits also includes a resistor 114 having the filter resistance Rf, a first terminal 115 coupled to the respective phase of the multiphase AC input 103, and a second terminal 116, and a capacitor 117 having the filter capacitance Cf, a first terminal 118 coupled to the second terminal 116 of the resistor 114, and a second terminal 119, where the second terminals 119 of the capacitors 117 of the individual phase circuits are coupled together. In one example, coupling the multiphase line interface filter 110 at 428 includes coupling the first terminal 115 of the resistors 114 of the individual phase circuits to the point of common coupling PCC of the respective phase of the multiphase AC input 203.

Figure 5:
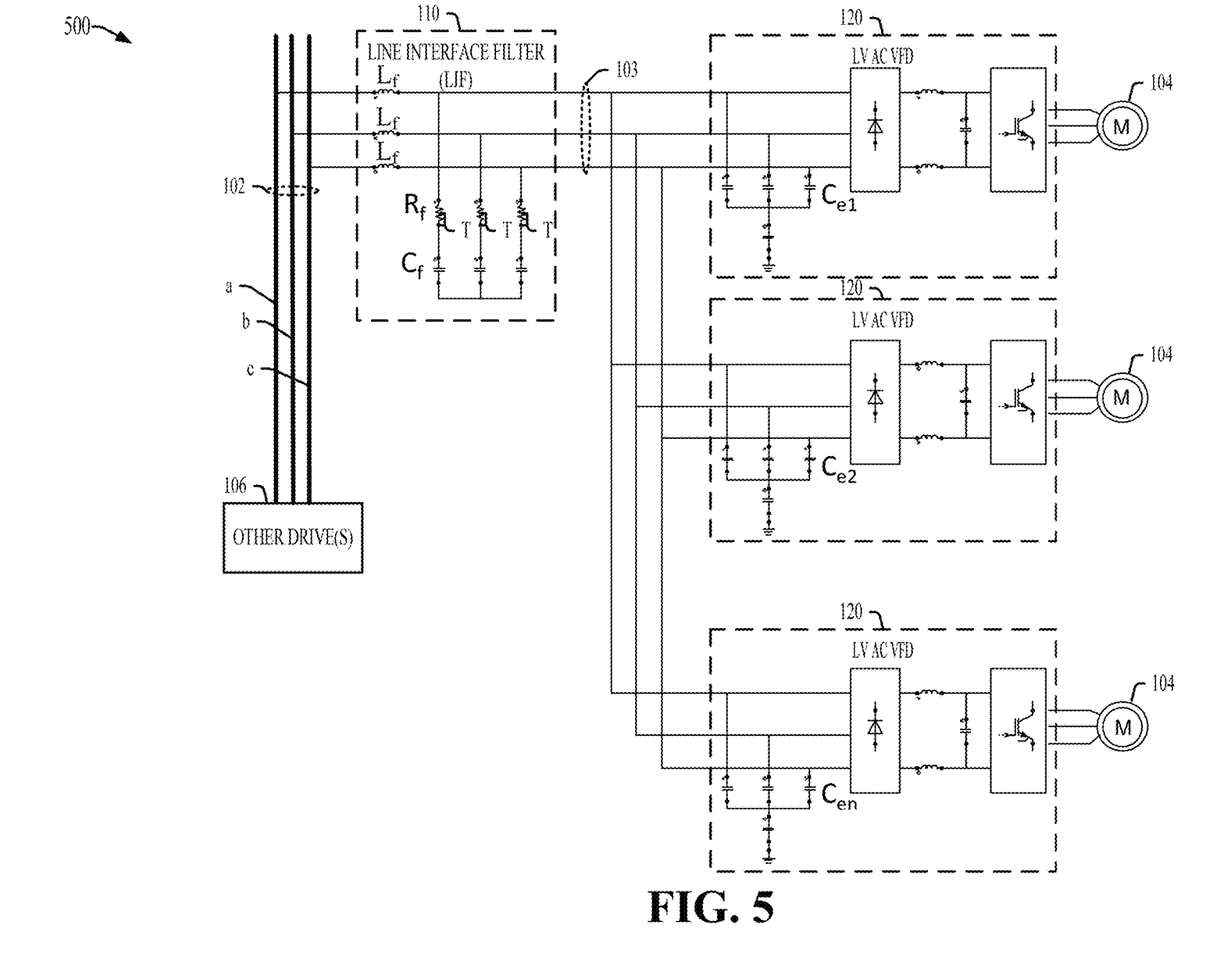
FIG. 5 is a schematic diagram of a power system with a shared AC bus and a line interface filter coupled to a group of drives having active front end rectifiers.

FIG. 5 shows a power system 500 with a shared AC bus 102 and a single line interface filter 110 coupled between the shared AC bus 102 and a group of LV AC VFD drives 120, each having an active a diode front end rectifier. The line interface filter 110 is generally as described above in connection with FIG. 1. In this example, the group drive inductance Lf for the line interface filter 110 is selected as 3% or 5% impedance based on the rated AC bus voltage and on the sum of the drive rated currents of the group of drives 120. In this example, moreover, the total drive inherent capacitance is determined as the sum of the internal EMI filter capacitances on a per phase basis. For an integer number 'n' grouped drives 120, the equivalent per-phase capacitance Ceq=Ce1+Ce2+ . . . +Cen.

FIG. 6 shows a shared AC bus system 600 having individualized line interface filters 110 and 220 respectively associated on an individual basis with the drives 120 having diode rectifiers (e.g., LV AC VFDs) and those that have SCR-based rectifier circuits (e.g., LV DC drives 220 of FIG. 2 above, and/or medium voltage AC drives such as MV AC VFDs 320 and isolation transformers 330 as in FIG. 3 above). The example system 600 includes a medium voltage AC source 601 coupled to the MV VFD drives 320 through a isolation transformer 330 via a medium voltage shared bus and associated line interface filters 210, a low voltage AC source 602, and a switch 604 (SW1) that couples a transformer 606 to either the low voltage source 602 or the medium voltage source 601. FIG. 7 shows another shared AC bus system 700 having a shared low voltage AC bus 102, the sources 601 and 602, the switch 604 and the transformer 606 described above. In this example, a single protective line interface filter 110 is coupled between the shared AC bus 102 and the multiphase AC inputs 103 of a group of "N" protected low voltage variable frequency drives 120.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A system, comprising:
a shared multiphase AC bus having a plurality of phase lines;
a first AC drive having: a first multiphase AC input; a first diode rectifier; a first input filter; and a first inverter; the first input filter being coupled between the first multiphase AC input and the first diode rectifier; and the first diode rectifier being coupled between the first input filter and the first inverter;
a multiphase line interface filter coupled between the shared multiphase AC bus and the first multiphase AC input, the multiphase line interface filter including a plurality of phase circuits coupled to respective ones of the phase lines of the shared multiphase AC bus, the individual phase circuits including:
an inductor having a first terminal coupled to the respective phase line of the shared multiphase AC bus, and a second terminal coupled to a respective phase of the first multiphase AC input;
a resistor having a first terminal coupled to the respective phase of the multiphase AC input, and a second terminal; and
a capacitor having a first terminal coupled to the second terminal of the resistor, and a second terminal;
the second terminals of the capacitors of the individual phase circuits being coupled together;
a further drive having a further AC input coupled to the shared multiphase AC bus, and an SCR rectifier coupled to the further AC input; and
a second AC drive having: a second multiphase AC input; a second diode rectifier; a second input filter; and a second inverter; the second input filter being coupled between the multiphase AC input and the second diode rectifier; and the second diode rectifier being coupled between the second input filter and the second inverter.

2. The system of claim 1, further comprising:
a second multiphase line interface filter coupled between the shared multiphase AC bus and the second multiphase AC input, the second multiphase line interface filter including a plurality of phase circuits coupled to respective ones of the phase lines of the shared multiphase AC bus, the individual phase circuits including:
a second inductor having a first terminal coupled to the respective phase line of the shared multiphase AC bus, and a second terminal coupled to a respective phase of the second multiphase AC input;
a second resistor having a first terminal coupled to the respective phase of the second multiphase AC input, and a second terminal; and
a second capacitor having a first terminal coupled to the second terminal of the second resistor, and a second terminal;
the second terminals of the second capacitors of the individual phase circuits being coupled together.

3. The system of claim 2, comprising a further line interface filter coupled between the shared multiphase AC bus and the further AC input, the further multiphase line interface filter including a plurality of further phase circuits coupled to respective ones of the phase lines of the shared multiphase AC bus, the individual further phase circuits including:
a further resistor having a first terminal coupled to the respective phase of the further multiphase AC input, and a second terminal; and
a further capacitor having a first terminal coupled to the second terminal of the further resistor, and a second terminal;
the second terminals of the further capacitors of the individual phase circuits being coupled together.

4. The system of claim 3, wherein:
the inductors of the individual phase circuits of the multiphase line interface filter have an inductance of 3% to 5% of a per-phase source impedance based on a rated AC bus voltage and total connected VA rating of the connected drive or drives;
the capacitors of the individual phase circuits of the multiphase line interface filter have a capacitance of 5 to 15 times a per-phase equivalent capacitance of the AC drive; and the resistors of the individual phase circuits of the multiphase line interface filter have a resistance greater than or equal to two times a damping ratio times a square root of a ratio of the inductance to the capacitance, where the damping ratio is greater than or equal to 1.0 and less than or equal to 2.0.

5. The system of claim 4, wherein:
the further resistors of the individual further phase circuits of the further line interface filter include a tap to set the corresponding resistance;
the resistors of the individual phase circuits of the multiphase line interface filter include a tap to set the corresponding resistance; and
the resistors of the individual phase circuits of the second multiphase line interface filter include a tap to set the corresponding resistance.

6. The system of claim 1, wherein:
the resistors of the individual phase circuits of the multiphase line interface filter include a tap to set the corresponding resistance; and
the resistors of the individual phase circuits of the second multiphase line interface filter include a tap to set the corresponding resistance.

7. A system, comprising:
a shared multiphase AC bus having a plurality of phase lines;
an AC drive having: a multiphase AC input; a diode rectifier; an input filter; and an inverter; the input filter being coupled between the multiphase AC input and the diode rectifier; and the diode rectifier being coupled between the input filter and the inverter;
a multiphase line interface filter coupled between the shared multiphase AC bus and the multiphase AC input, the multiphase line interface filter including a plurality of phase circuits coupled to respective ones of the phase lines of the shared multiphase AC bus, the individual phase circuits including:
an inductor having a first terminal coupled to the respective phase line of the shared multiphase AC bus, and a second terminal coupled to a respective phase of the multiphase AC input;
a resistor having a first terminal coupled to the respective phase of the multiphase AC input, and a second terminal; and
a capacitor having a first terminal coupled to the second terminal of the resistor, and a second terminal;
the second terminals of the capacitors of the individual phase circuits being coupled together;
a further drive having a further AC input coupled to the shared multiphase AC bus, and an SCR rectifier coupled to the further AC input; and
a further line interface filter coupled between the shared multiphase AC bus and the further AC input, the further multiphase line interface filter including a plurality of further phase circuits coupled to respective ones of the phase lines of the shared multiphase AC bus, the individual further phase circuits including:
a further resistor having a first terminal coupled to the respective phase of the further multiphase AC input, and a second terminal; and
a further capacitor having a first terminal coupled to the second terminal of the further resistor, and a second terminal;
the second terminals of the further capacitors of the individual phase circuits being coupled together.

8. The system of claim 7, wherein the resistors of the individual phase circuits of the multiphase line interface filter include a tap to set the corresponding resistance.

9. The system of claim 7, wherein the first terminal of the further resistors of the individual further phase circuits is coupled to a point of common coupling of the respective phase of the further multiphase AC input.

10. A method to couple a drive or group of drives to a shared multiphase AC bus having a plurality of phase lines, the method comprising:
determining a filter inductance as one of 3% to 5% of a per-phase equivalent inductance of an input reactor based on a total KVA rating and a rated voltage of a single LV AC drive or group of LV AC drives, 3% to 5% of a per-phase equivalent inductance of an input reactor based on a KVA rating and a rated voltage of a single LV DC drive, and 5% to 8% of a per-phase equivalent inductance of an isolation transformer;
determining a filter capacitance as 5 to 15 times a per-phase equivalent capacitance of the drive or group of drives;
determining a filter resistance as greater than or equal to two times a damping ratio times a square root of a ratio of the filter inductance to the filter capacitance, where the damping ratio is greater than or equal to 1.0 and less than or equal to 2.0;
coupling a multiphase line interface filter between the drive or group of drives and the shared multiphase AC bus, the multiphase line interface filter including a plurality of phase circuits coupled to respective ones of the phase lines of the shared multiphase AC bus, the individual phase circuits including:
an inductor having the filter inductance, a first terminal coupled to the respective phase line of the shared multiphase AC bus, and a second terminal coupled to a respective phase of a multiphase AC input of the drive or group of drives;
a resistor having the filter resistance, a first terminal coupled to the respective phase of the multiphase AC input, and a second terminal; and
a capacitor having the filter capacitance, a first terminal coupled to the second terminal of the resistor, and a second terminal;
the second terminals of the capacitors of the individual phase circuits being coupled together.

11. The method of claim 10, further comprising connecting a tap of the resistors of the individual phase circuits to set the filter resistance.

12. The method of claim 10, wherein coupling the multiphase line interface filter between the drive or group of drives and the shared multiphase AC bus comprises coupling the first terminal of the resistors of the individual phase circuits to a point of common coupling of the respective phase of the multiphase AC input.

13. The method of claim 10, wherein the drive or group of drives includes an AC drive having: an active rectifier; an input filter; and an inverter; the input filter being coupled between the multiphase AC input and the active rectifier; and the active rectifier being coupled between the input filter and the inverter.

* * * * *